United States Patent
Cheon et al.

(10) Patent No.: US 7,783,944 B2
(45) Date of Patent: Aug. 24, 2010

(54) SEMICONDUCTOR MEMORY DEVICE AND METHOD THEREOF

(75) Inventors: Kwun-soo Cheon, Suwon-si (KR); Chang-yong Lee, Suwon-si (KR); Won-kyung Chung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 214 days.

(21) Appl. No.: 12/000,648

(22) Filed: Dec. 14, 2007

(65) Prior Publication Data

US 2008/0165596 A1    Jul. 10, 2008

(30) Foreign Application Priority Data

Dec. 15, 2006    (KR) .................... 10-2006-0128958

(51) Int. Cl.
*G11C 29/00* (2006.01)
*G11C 7/00* (2006.01)

(52) U.S. Cl. ....................... 714/719; 365/201
(58) Field of Classification Search ............... 714/719, 714/718; 365/194, 201
See application file for complete search history.

(56) References Cited

U.S. PATENT DOCUMENTS

| | | | | |
|---|---|---|---|---|
| 4,449,207 A * | 5/1984 | Kung et al. | ............ | 365/189.02 |
| 5,706,234 A * | 1/1998 | Pilch et al. | ............ | 365/201 |
| 6,047,344 A * | 4/2000 | Kawasumi et al. | ............ | 710/107 |
| 6,694,461 B1 | 2/2004 | Treuer | | |
| 6,829,181 B1 * | 12/2004 | Seitoh | ............ | 365/201 |
| 7,434,121 B2 * | 10/2008 | Astor | ............ | 714/718 |
| 2001/0016893 A1 * | 8/2001 | Merritt | ............ | 711/1 |
| 2002/0071326 A1 * | 6/2002 | Suzuki | ............ | 365/201 |
| 2002/0194546 A1 * | 12/2002 | Ooishi | ............ | 714/42 |
| 2004/0049724 A1 * | 3/2004 | Bill et al. | ............ | 714/733 |
| 2004/0216006 A1 * | 10/2004 | Kim et al. | ............ | 714/30 |
| 2005/0108607 A1 * | 5/2005 | Chae et al. | ............ | 714/738 |
| 2005/0257107 A1 * | 11/2005 | Kim | ............ | 714/718 |
| 2006/0129701 A1 * | 6/2006 | Qawami et al. | ............ | 710/4 |

FOREIGN PATENT DOCUMENTS

JP    05-128014    5/1993

(Continued)

OTHER PUBLICATIONS

Jain, S.K.; Stroud, C.E.; , "Built-in Self Testing of Embedded Memories," Design & Test of Computers, IEEE , vol. 3, No. 5, pp. 27-37, Oct. 1986 doi: 10.1109/MDT.1986.295041.*

(Continued)

*Primary Examiner*—Cynthia Britt
(74) *Attorney, Agent, or Firm*—Harness, Dickey & Pierce, P.L.C.

(57) ABSTRACT

A semiconductor memory device and method thereof are provided. The example semiconductor memory device may include a memory cell array including a plurality of memory cells, an expected data generating unit receiving a plurality of initial expected data through at least one address pad during a memory operation and generating a plurality of expected data based on the plurality of initial expected data, the at least one address pad being separate from a data input/output pad and a parallel bit test circuit generating test result data based on a plurality of read data and the plurality of expected data.

21 Claims, 4 Drawing Sheets

FOREIGN PATENT DOCUMENTS

| | | |
|---|---|---|
| JP | 07-099000 | 4/1995 |
| JP | 2003-315414 | 11/2003 |
| KR | 10-1996-0002016 B1 | 2/1996 |
| KR | 1020040092260 A | 11/2004 |
| KR | 1020050046461 A | 5/2005 |
| KR | 1020060006432 A | 1/2006 |

OTHER PUBLICATIONS

Nianxiong Tan; Eriksson, S.; Wanhammar, L.; , "A power-saving technique for bit-serial DSP ASICs," Circuits and Systems, 1994. ISCAS '94., 1994 IEEE International Symposium on , vol. 4, No., pp. 51-54 vol. 4, May 30-Jun. 2, 1994 doi: 10.1109/ISCAS.1994.409194.*

Catthoor, F.; Dutt, N.D.; Kozyrakis, C.E.; , "How to solve the current memory access and data transfer bottlenecks: at the processor architecture or at the compiler level?," Design, Automation and Test in Europe Conference and Exhibition 2000. Proceedings , vol., No., pp. 426-433, 2000 doi: 10.1109/Date.2000.840306.*

Korean Notice of Allowance dated Nov. 26, 2007.

* cited by examiner

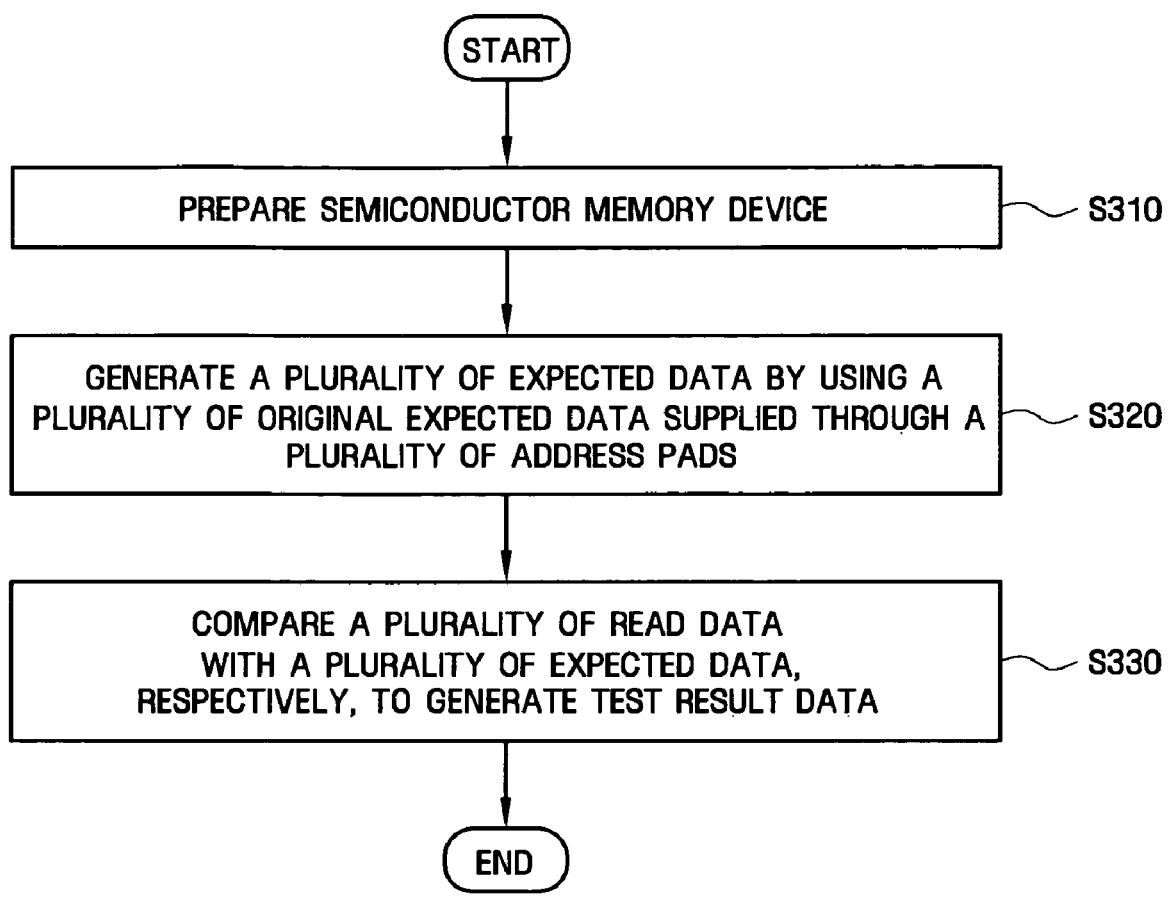

SEMICONDUCTOR MEMORY DEVICE AND METHOD THEREOF

PRIORITY STATEMENT

This application claims priority from Korean Patent Application No. 10-2006-0128958 filed on Dec. 15, 2006 in the Korean Intellectual Property Office, the disclosure of which is incorporated herein by reference in its entirety.

BACKGROUND

1. Field

Example embodiments relate generally to a semiconductor memory device and method thereof.

2. Description of the Related Art

Semiconductor memory devices may be manufactured through a series of steps, such as design and process of semiconductor circuits, chip tests or tests after packaging. After fabrication, chip tests or the tests after packaging may be used to test semiconductor memory devices. Then, the tested semiconductor memory devices may enter the market.

In a conventional parallel bit test, test pattern data may be written into a plurality of memory cells of a semiconductor memory device, and the written test pattern data may be read. The read test pattern data and the written test pattern data may be compared to generate a comparison result, and a logic level of the comparison result may indicate whether a given tested semiconductor memory device may be functioning normally.

For example, the same data may be written in two memory cells among four memory cells. The two read data, which may be output from the memory cells having the same data written thereto, may be compared with each other, and a determination may be made as to whether the memory cells are normal based on the comparison result (e.g., if the comparison result for each respective memory cell is the same, normal operation may be determined, else bad or erroneous operation may be determined). For example, 4-bit data may be compared to generate one test result data, and if it is determined that the test result data indicates that the memory cells are defective, the four "defective" memory cells may be replaced with redundant memory cells. However, because the same data may be written into the memory cells to be compared, the formatting of the test pattern data may be relatively limited.

In another conventional parallel bit test process, "expected" data may be used. According to this process, expected data, which may correspond to the test pattern data written into a plurality of memory cells, may be input during a read operation. The expected data may be compared with read data, which may be read from the memory cells. Logic levels of the comparison results may be analyzed, and a determination may be made as to whether the memory cells are normal or defective. For example, 4-bit expected data, which may correspond to 4-bit data written into four memory cells, may be input again during a read operation. The 4-bit expected data may be compared with 4-bit read data so as to generate one test result data, and if the test result data indicates that the memory cells are defective, the four memory cells may be replaced with redundant memory cells.

However, in a conventional parallel bit test process, because the expected data may be input through a data bus (or data input/output pad) during a read operation, a read burst operation may not be performed. A read burst operation may correspond to consecutive or sequential read operations which may be performed repeatedly (e.g., without pauses or wait-states).

FIGS. 1A and 1B are timing diagrams illustrating a conventional parallel bit process.

Referring to FIG. 1A, at time t1, a first read command may be input at a rising edge of a clock, and expected data may be input through a data input/output pad together with the first read command. Test result data may be output for a given period of time (e.g., a time) after a given time interval tAA (hereinafter, referred to as "test result data output time). Here, tAA+α may be larger than a clock cycle tCC. Therefore, at time t2, a second read command may not be input at the rising edge of the clock because test result data being output and expected data, which may be input together with the second read command, may collide with each other because the same data bus is being used. Therefore, in order to perform the read burst operation, as shown in FIG. 1B, the clock period tCC may be configured to be larger than tAA+α, which may increase the clock cycle tCC, and may reduce an operating speed of the semiconductor memory device.

SUMMARY OF EXAMPLE EMBODIMENTS

An example embodiment is directed to a semiconductor memory device, including a memory cell array including a plurality of memory cells, an expected data generating unit receiving a plurality of initial expected data through at least one address pad during a memory operation and generating a plurality of expected data based on the plurality of initial expected data, the at least one address pad being separate from a data input/output pad and a parallel bit test circuit generating test result data based on a plurality of read data and the plurality of expected data.

Another example embodiment is directed to a parallel bit test method testing a semiconductor memory device including a memory cell array having a plurality of memory cells, including receiving a plurality of initial expected data through at least one address pad during a memory operation, the at least one address pad being separate from a data input/output pad, generating a plurality of expected data based on the plurality of initial expected data, and generating test result data based on a plurality of read data and the plurality of expected data.

BRIEF DESCRIPTION OF THE DRAWINGS

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

FIG. 5 is a flowchart illustrating operation of the semiconductor memory device of FIG. 2 according to another example embodiment.

DETAILED DESCRIPTION OF EXAMPLE EMBODIMENTS

Figure 1A:
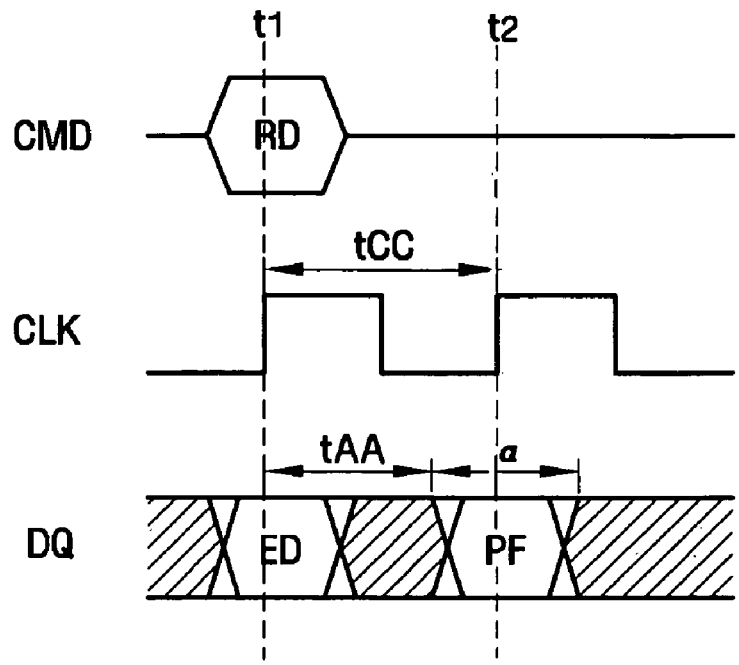
FIGS. 1A and 1B are timing diagrams illustrating a conventional parallel bit process.

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

Accordingly, while example embodiments are susceptible to various modifications and alternative forms, specific embodiments thereof are shown by way of example in the drawings and will herein be described in detail. It should be understood, however, that there is no intent to limit example embodiments to the particular forms disclosed, but conversely, example embodiments are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
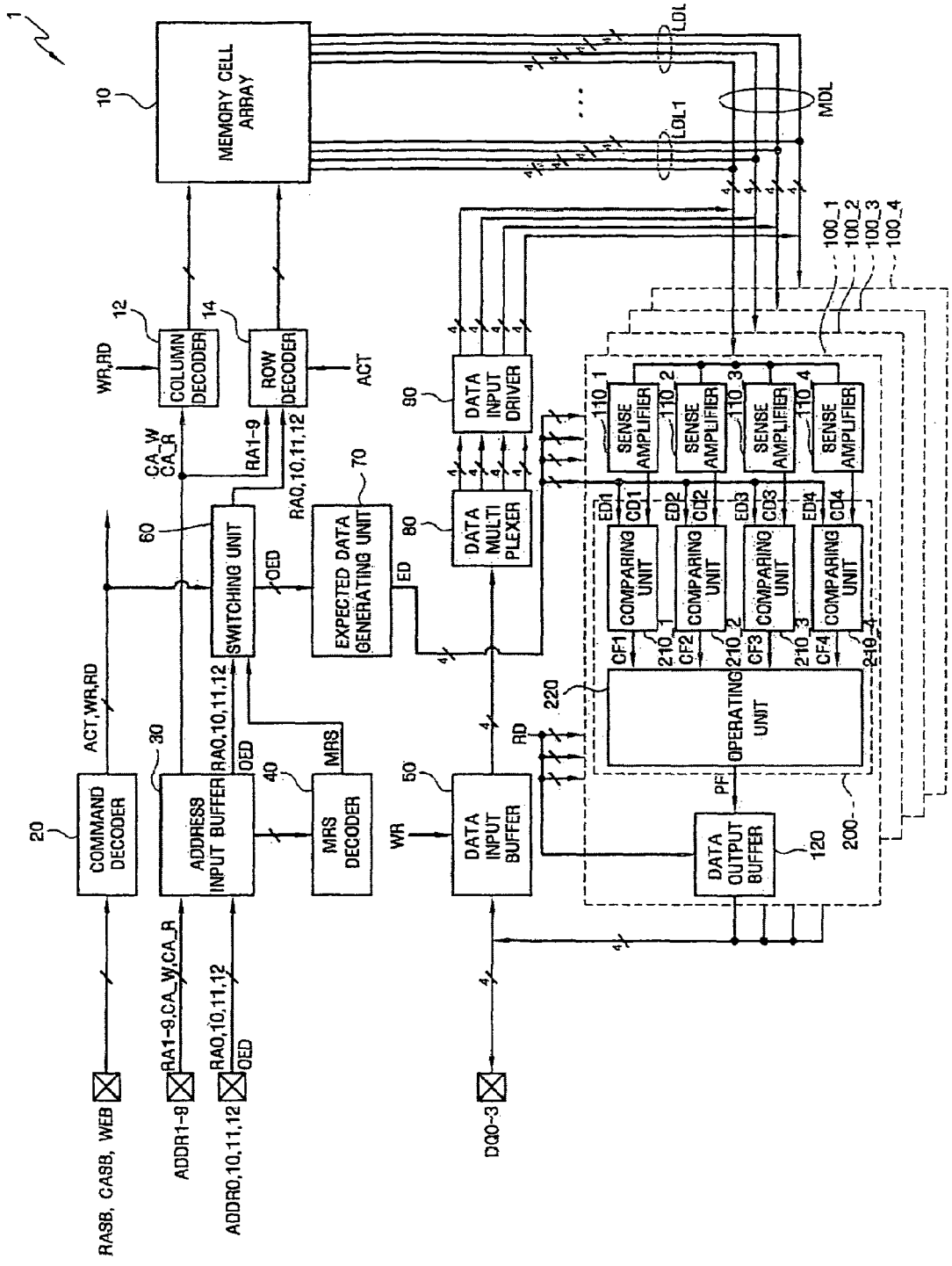
FIG. 2 is a block diagram illustrating a semiconductor memory device according to an example embodiment.

FIG. 2 is a block diagram illustrating a semiconductor memory device 1 according to an example embodiment.

In the example embodiment of FIG. 2, the semiconductor memory device 1 may receive a plurality of commands, a plurality of addresses, a plurality of data, etc., which may be supplied from a tester (not shown), and may perform a parallel bit test. The semiconductor memory device 1 may include a memory cell array 10, a column decoder 12, a row decoder 14, a command decoder 20, an address input buffer 30, a mode register set (MRS) decoder 40, a data input buffer 50, a switching unit 60, an expected data generating unit 70, a data multiplexer 80, a data input driver 90, and data output circuits 100_1, 100_2, 100_3, and 100_4. Further, each of the data output circuits 100_1, 100_2, 100_3, and 100_4 may include a plurality of sense amplifiers 110_1, 110_2, 110_3, and 110_4, a parallel bit test circuit 200, and a data output buffer 120.

In the example embodiment of FIG. 2, the memory cell array 10 may include a plurality of memory cells, and each of the memory cells may be coupled between a word line and a bit line. The memory cell may be, for example, a dynamic random access memory (DRAM) cell. In an example, the memory cell may include a cell capacitor that stores data, and an access transistor that provides access to the cell capacitor.

In the example embodiment of FIG. 2, the column decoder 12 and the row decoder 14 may decode column addresses and row addresses, respectively, and access memory cells, where a write or read operation may be performed, in the memory cell array 10. For example, the column decoder 12 may be enabled if a memory command (e.g., a write command WR or a read command RD) is received, and may decode a column address CA_W that is supplied during a write operation and a column address CA_R that is supplied during a read operation. The row decoder 14 may be enabled if an active command ACT is received and may decode row addresses RA1 to 9, and RA0, 10, 11, and 12.

In the example embodiment of FIG. 2, the command decoder 20 may receive a plurality of commands RASB, CASB, WEB, etc., from the tester, may decode the commands, and may generate internal commands ACT, WR, and RD. For example, the active command ACT may be generated if the command CASB is at a first logic level (e.g., a higher logic level or logic "1"), the command RASB is at a second logic level (e.g., a lower logic level or logic "0"), and the command WEB is at the first logic level. In another example, the write command WR may be generated if the command RASB is at the first logic level, the command CASB is at the second logic level, and the command WEB is at the first logic level. In another example, the read command RD may be generated if the command RASB is at the first logic level, the command CASB is at the second logic level, and the command WEB is at the second logic level. However, it is understood that other example embodiments may trigger the different commands under different configurations.

In the example embodiment of FIG. 2, the address input buffer 30 may receive addresses RA1 to 9, CA_W, CA_R, and RA0, 10, 11, 12, and "original" or initial expected data OED from the tester through a plurality of address pads ADDR1 to 9, and ADDR0, 10, 11, and 12, and may buffer the received signals In an example, for the convenience of explanation, the plurality of address pads ADDR1 to 9 may be grouped into a first address pad group, and the plurality of address pads ADDR0, 10, 11, and 12 may be grouped into a second address pad group. The numbers of the address pads that may be divided into the first and second address pad groups are given for example purposes and simplicity of description only, such that other example embodiments may group address pads in any well-known manner.

In the example embodiment of FIG. 2, in an example, if the active command ACT is input to the semiconductor memory device 1, the address input buffer 30 may receive the row addresses RA1 to 9 through the first address pad group, and the row addresses RA0, 10, 11, and 12 through the second address pad group. If the write command WR is input to the semiconductor memory device 1, the address input buffer 30 may receive the column address CA_W through the first address pad group, and signals, which may be supplied through the second address pad group, may correspond to "don't care" states (e.g., the first logic level, the second logic level, a metastable state, etc.) because such signals need not affect an operation of the semiconductor memory device 1. If the read command RD is input to the semiconductor memory device 1, the address input buffer 30 may receive the column address CA_R through the first address pad group and the original expected data OED through the second address pad group.

In the example embodiment of FIG. 2, the MRS decoder 40 may receive at least one address from the address input buffer 30, may decode the address, and may generate a mode register set signal MRS. The generated mode register set signal MRS may indicate a mode of the semiconductor memory device 1 (e.g., whether the semiconductor memory device 1 enters a parallel bit test mode). In an example, the mode register set signal MRS only controls the switching unit 60. However, it will be appreciated that the mode register set signal MRS may control any number of devices within the semiconductor memory device 1 (e.g., other control settings associated with the parallel bit test mode).

In the example embodiment of FIG. 2, the data input buffer 50 may be enabled if a write command WR is received. The data input buffer 50 may receive a plurality of pattern data from the tester and may buffer the received pattern data. The data multiplexer 80 may receive the test pattern data from the data input buffer 50 and may multiplex the test pattern data. In an example, the data multiplexer 80 may multiplex 4-bit test pattern data and may output four groups of 16-bit pattern data. However, it is understood that other example embodiments may be configured for different numbers of test patterns and/or different sizes of test patterns.

In the example embodiment of FIG. 2, the data input driver 90 may write the multiplexed test pattern data into the memory cells in the memory cell array 10. As shown in the example embodiment of FIG. 2, the data input driver 90 may output the multiplexed test pattern data to a main data line MDL, and the multiplexed test pattern data may pass through the main data line MDL and local data lines LDL1 to LDLn, and may be written into the memory cells in the memory cell array 10.

In the example embodiment of FIG. 2, the data output circuits 100_1, 100_2, 100_3, and 100_4 may determine whether the data that is output through the local data lines LDL1 to LDLn, and the main data line MDL from the memory cell array 10, may be normal or defective, and may output the data. For example, each of the data output circuits 100_1, 100_2, 100_3, and 100_4 may include a plurality of sense amplifiers 110_1, 110_2, 110_3, and 110_4, a parallel bit test circuit 200, and a data output buffer 120, and the parallel bit test circuit 200 may include comparing units 210_1, 210_2, 210_3, and 210_4 and an operating unit 220.

In the example embodiment of FIG. 2, the plurality of sense amplifiers 110_1, 110_2, 110_3, and 110_4 may amplify the plurality of data, respectively, which may be output from the memory cell array 10, and may output the amplified data. The comparing units 210_1, 210_2, 210_3, and 210_4 may compare read data CD1, CD2, CD3, and CD4, which may be output through the plurality of sense amplifiers 110_1, 110_2, 110_3, and 110_4, with expected data ED1, ED2, ED3, and ED4, which may be generated from the expected data generating unit 70, and may supply comparison result data CF1, CF2, CF3, and CF4. The operating unit 220 may perform a given logic operation on the comparison result data CF1, CF2, CF3, and CF4, and may supply test result data PF. The data output buffer 120 may buffer the test result data and may output the buffered test result data through input/output pads DQ0 to 3.

Figure 3:
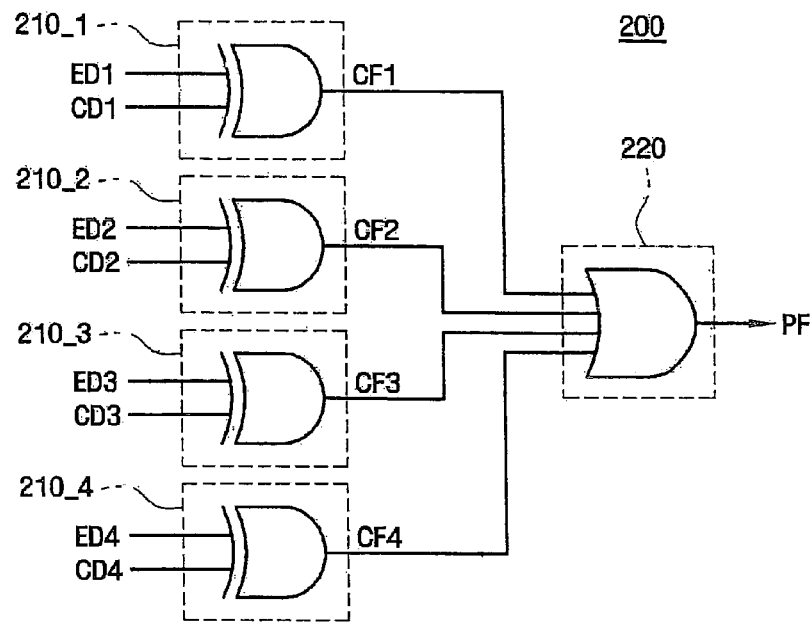
FIG. 3 illustrates a circuit diagram of a parallel bit test circuit according to an example embodiment.

FIG. 3 illustrates a circuit diagram of the parallel bit test circuit 200 of FIG. 2 according to an example embodiment.

In the example embodiment of FIG. 3, the read data CD1, CD2, CD3, and CD4 may correspond to expected data ED1, ED2, ED3, and ED4, respectively, and the comparing units 210_1, 210_2, 210_3, and 210_4 may output the comparison result data CF1, CF2, CF3, and CF4, each of which may be set to the second logic level (e.g., a lower logic level or logic "0") or the first logic level (e.g., a higher logic level or logic "1"). In an example, the comparing units 210_1, 210_2, 210_3, and 210_4 may be embodied as XOR gates. If the comparison result data CF1, CF2, CF3, and CF4 are each set to the second logic level, the operating unit 220 may output test result data PF at the second logic level. Alternatively, if at least one comparison data is set to the first logic level (e.g., a higher logic level or logic "1"), the operating unit 220 may output test result data PF that may be set to the first logic level. In an example, the operating unit 220 may be embodied as an OR gate.

In the example embodiment of FIG. 3, the read data CD1, CD2, CD3, and CD4 and the expected data ED1, ED2, ED3, and ED4, which may correspond to each other, may be the same, each of the plurality of comparison result data CF1, CF2, CF3, and CF4 may transition to the second logic level (e.g., a lower logic level or logic "0"), and the test result data PF may transition to the second logic level (e.g., a lower logic level or logic "0"). In this example, each of the four memory cells may be determined to be normal. In an alternative example, if at least one read data and expected data among the read data CD1, CD2, CD3, and CD4 and the expected data ED1, ED2, ED3, and ED4, which may correspond to each other, are different from each other (e.g., if the expected data ED1 and the read data CD1 are different from each other), a comparison result data having the second logic level (e.g., CF1) (e.g., a lower logic level or logic "0") may be generated, and test result data PF may transition to the first logic level (e.g., a higher logic level or logic "1"). In this example, at least one of the four memory cells may be determined to be defective, and the four memory cells may be replaced with redundant memory cells.

Returning to the example embodiment of FIG. 2, expected data ED in the semiconductor memory device 1 may be generated based on a plurality of original expected data OED that are supplied through the second address pad group. Accordingly, unlike the conventional art, the semiconductor memory device 1 need not be supplied with the expected data through the data input/output pad DQ0 to 3, such that a data read burst may be performed because the data input/output pad DQ0 to 3 need not be "locked up".

For example, referring to the example embodiment of FIG. 2, the row addresses RA1 to 9, and RA0, 10, 11, and 12 may be supplied through the plurality of address pads ADDR1 to 9, and ADDR0, 10, 11, and 12 (e.g., both first and second address pad groups) during an active operation, while the column addresses CA_W and CA_R may be supplied through some of the address pads ADDR1 to 9 (e.g., first address pad group) during a write operation and a read operation. Therefore, original expected data OED may be supplied through the address pads ADDR0, 10, 11, and 12 (e.g., second address pad group), which may be in an idle state during the read operation.

In the example embodiment of FIG. 2, the switching unit 60 may be enabled if the mode register set signal MRS is received (e.g., indicating a parallel bit test mode). The switching unit 60 may transmit the row addresses RA0, 10, 11, and 12, which may be input through the second address pad group, to the row decoder 14 in response to the active command ACT, and may transmit the original expected data OED, which may be input through the second address pad group, to the expected data generating unit 70 in response to the read command RD.

In the example embodiment of FIG. 2, the expected data generating unit 70 may generate the expected data ED based on the transmitted original expected data OED. The expected data generating unit 70 may generate the expected data based on any of a number of processes. For example, as shown in Table 1 (below), a plurality of original expected data OED and a plurality of expected data ED may correspond to each other, respectively, and the plurality of expected data ED may be generated so as to have the same logic levels as the plurality of corresponding original expected data OED. In Table 1, original expected data OED1 may correspond to expected data ED1, original expected data OED2 may correspond to expected data ED2, original expected data OED3 may correspond to expected data ED3, and original expected data OED4 may correspond to expected data ED4.

TABLE 1

| ORIGINAL EXPECTED DATA (OED) | | | | EXPECTED DATA (ED) | | | |
|---|---|---|---|---|---|---|---|
| OED1 | OED2 | OED3 | OED4 | ED1 | ED2 | ED3 | ED4 |
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 1 | 0 | 0 | 0 | 1 | 0 | 0 |
| 1 | 0 | 0 | 0 | 1 | 0 | 0 | 0 |
| 0 | 0 | 1 | 1 | 0 | 0 | 1 | 1 |
| 0 | 1 | 0 | 1 | 0 | 1 | 0 | 1 |
| 1 | 0 | 0 | 1 | 1 | 0 | 0 | 1 |
| 0 | 1 | 1 | 0 | 0 | 1 | 1 | 0 |
| 1 | 0 | 1 | 0 | 1 | 0 | 1 | 0 |
| 1 | 1 | 0 | 0 | 1 | 1 | 0 | 0 |
| 0 | 1 | 1 | 1 | 0 | 1 | 1 | 1 |
| 1 | 0 | 1 | 1 | 1 | 0 | 1 | 1 |
| 1 | 1 | 0 | 1 | 1 | 1 | 0 | 1 |
| 1 | 1 | 1 | 0 | 1 | 1 | 1 | 0 |
| 1 | 1 | 1 | 1 | 1 | 1 | 1 | 1 |

It will be appreciated that Table 1 illustrates only one possible example configuration of generating the expected data based on the "original" expected data. In another example, the plurality of original expected data OED may be inverted to generate the expected data. In yet another example, a given logic operation may be performed on the plurality of original expected data OED to generate the plurality of expected data ED. Further, in Table 1, 4-bit expected data ED may be generated by using 4-bit original expected data OED. However, other example embodiments may be directed to data having any bit size (e.g., 2-bit, 3-bit, etc.).

In the example embodiment of FIG. 2, the semiconductor memory device 1 may generate the expected data using the original expected data supplied through the address pads, such that a format of the expected data need not be limited to any particular format (e.g., 0000, 1111, 0011, 1100, etc.). In other words, the "original" expected data may be modified, if necessary, into the expected data so as to conform with any desired format. Generally, while above-described example embodiments are directed to a semiconductor memory device of ×4 DQ type, in which 4-bit test result data or 4-bit test pattern data are described, it will be appreciated that other example embodiments may be directed to ×8 DQ type, ×16 DQ type, ×32 DQ type, etc.

Example operation of the semiconductor memory device 1 of FIG. 2 will now be described in greater detail with respect to FIGS. 4 and 5.

Figure 4:
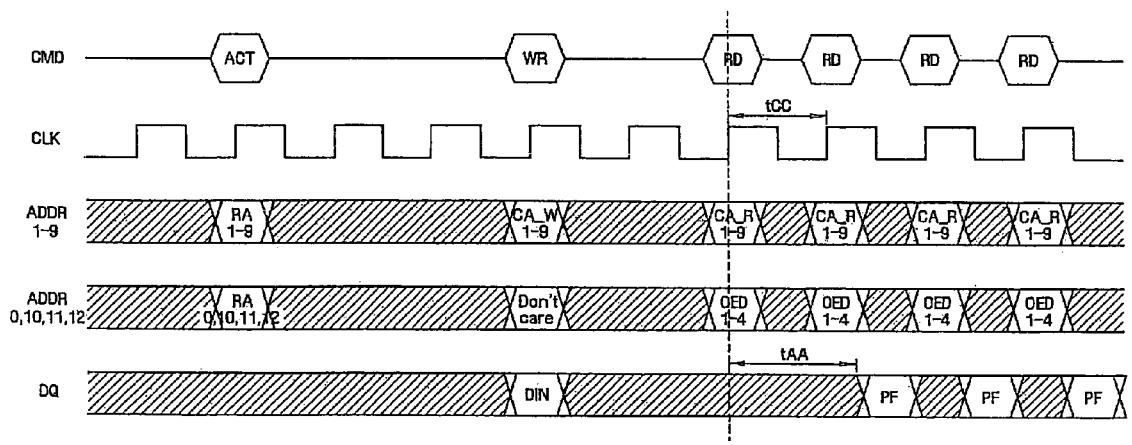
FIG. 4 is a timing diagram illustrating operation of the semiconductor memory device of FIG. 2 according to an example embodiment.

FIG. 4 is a timing diagram illustrating operation of the semiconductor memory device 1 of FIG. 2 according to an example embodiment.

FIG. 5 is a flowchart illustrating operation of the semiconductor memory device 1 of FIG. 2 according to another example embodiment.

In the example embodiments of FIGS. 2 and 4, an active command ACT may be generated. During the active operation, the row addresses RA1 to 9 may be supplied through the first address pad group, and the row addresses RA0, 10, 11, and 12 may be supplied through the second address pad group. In an example, the switching unit 60 may transmit the row addresses RA0, 10, 11, and 12, which may be supplied through the second address pad group, to the row decoder 14. The row decoder 14 may decode the transmitted row addresses RA0, 10, 11, and 12 and may select a given word line in the memory cell array 10.

In the example embodiments of FIGS. 2 and 4, a write command WR may be generated. During the write operation, the column addresses CA_W1 to 9 may be generated through the first address pad group, and signals, which may be supplied through the second address pad group, may be set to "don't care" states such that a logic level of the respective signals may not affect an operation of the semiconductor memory device 1. The column decoder 12 may decode the column addresses CA_W1 to 9, and may select a given bit line in the memory cell array 10. The data input buffer 50 may receive a plurality of test pattern data DIN, and the data multiplexer 80 may receive the test pattern data DIN from the data input buffer 50 and may multiplex the received test pattern data DIN. The data input driver 90 may write the multiplexed test pattern data DIN into the selected memory cell in the memory cell array 10.

In the example embodiments of FIGS. 2 and 4, a read command RD may be generated. During the read operation, the column addresses CA_R1 to 9 may be supplied through the first address pad group, and the plurality of original expected data OED1 to 4 may be supplied through the second address pad group. The column decoder 12 may decode the column addresses CA_W1 to 9 and may select a given bit line in the memory cell array 10. Further, the switching unit 60 may transmit a plurality of original expected data OED1 to 4, which may be supplied through the second address pad group, to the expected data generating unit 70. The expected data generating unit 70 may generate a plurality of expected data based on the plurality of original expected data OED1 to 4. The data output circuits 100_1, 100_2, 100_3, and 100_4 may compare a plurality of read data CD1, CD2, CD3, and CD4, which may be read from the memory cell array 10, with the plurality of expected data ED, respectively, and may generate test result data PF.

Referring to the example embodiment of FIG. 4, even if a time tAA until the test result data PF is output after the read command RD is input is longer than a cycle tCC of a clock CLK, the read operation may be performed continuously or repeatedly such that a read burst operation may be achieved, for example, because the expected data may be input through the address pads, not through the data input/output pads. In the timing diagram of FIG. 4, for simplicity of description, the time tAA is illustrated as longer than the cycle tCC. However, the time tAA may be shorter than the cycle tCC. Therefore, the time tCC need not be limited by the cycle tAA. Further, the read burst operation may increase a test efficiency of the semiconductor memory device.

Figure 1B:
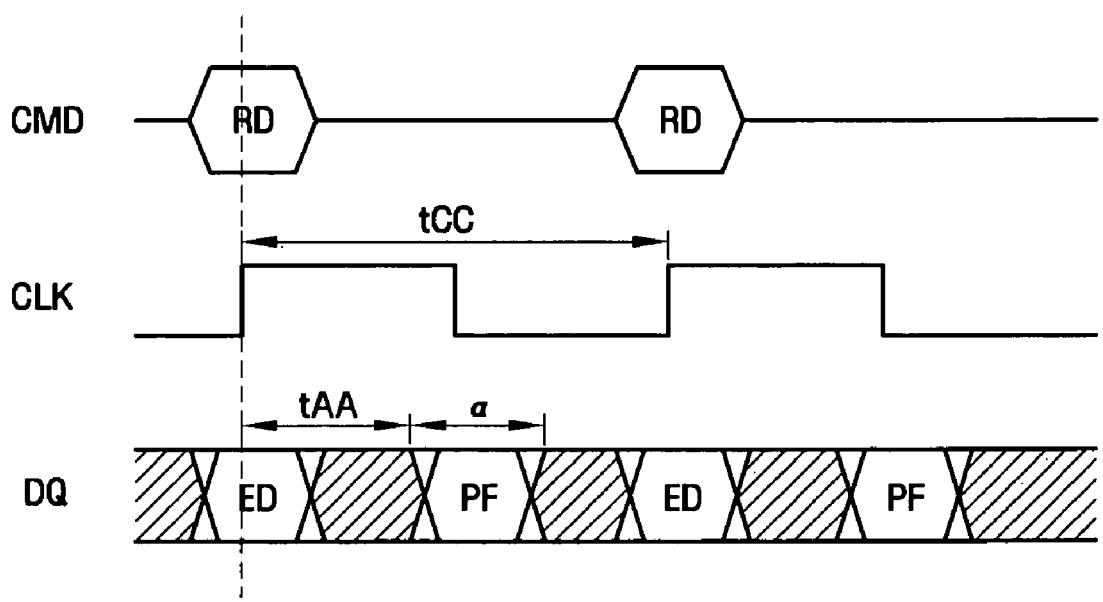

Referring to the example embodiment of FIG. 5, in an example parallel bit test process of the semiconductor memory device 1 of FIG. 2, a semiconductor memory device (e.g., semiconductor memory device 1 of FIG. 1) may be prepared and connected to a tester (at S310). Then, a plurality of expected data may be generated (e.g., adjusted, etc.) based on a plurality of "original" expected data supplied through a plurality of address pads (at S320). A plurality of read data may be compared with the plurality of expected data, respectively, so as to generate test result data (at S330).

In another example embodiment, because the expected data (e.g., which may correspond to the "original" or initial expected data, which may be adjusted to conform to a format other than a format of the original expected data, etc.) may be generated based on the plurality of original expected data, which may be supplied through the address pads, the expected data may conform to any desired format, and need not be limited to an "originally" supplied format. Further, because the cycle tCC of the clock CLK need not be limited by the time tAA (e.g., by waiting until the test result data PF is output) (e.g., because a different connection port may be used), an operating speed may be increased because a shorter clock cycle tCC may be achieved and a read burst operation may also be achieved.

Example embodiments being thus described, it will be obvious that the same may be varied in many ways. For example, it is understood that the above-described first and second logic levels may correspond to a higher level and a lower logic level, respectively, in an example embodiment. Alternatively, the first and second logic levels/states may correspond to the lower logic level and the higher logic level, respectively, in other example embodiments.

Such variations are not to be regarded as a departure from the spirit and scope of example embodiments, and all such modifications as would be obvious to one skilled in the art are intended to be included within the scope of the following claims.

What is claimed is:

1. A semiconductor memory device, comprising:
   a memory cell array including a plurality of memory cells;
   an expected data generating unit receiving a plurality of initial expected data through at least one address pad during a memory operation and generating a plurality of expected data based on the plurality of initial expected data, the at least one address pad being separate from a data input/output pad; and
   a parallel bit test circuit generating test result data based on a plurality of read data and the plurality of expected data.

2. The semiconductor memory device of claim 1, wherein the parallel bit test circuit compares the plurality of read data, which are read from the plurality of memory cells, respectively, with the plurality of expected data during the memory operation to generate the test result data.

3. The semiconductor memory device of claim 1, wherein the memory operation is a read operation.

4. The semiconductor memory device of claim 1, wherein the plurality of initial expected data corresponds to the plurality of expected data, respectively.

5. The semiconductor memory device of claim 4, wherein the plurality of initial expected data and the plurality of expected data have the same respective logic levels.

6. The semiconductor memory device of claim 1, wherein the at least one address pad includes a plurality of address pads divided into a first address pad group and a second address pad group, and during the memory operation, a plurality of column addresses are supplied through the first address pad group, and the plurality of initial expected data are supplied through the second address group.

7. The semiconductor memory device of claim 1, wherein the semiconductor memory device is a synchronous memory device that operates in synchronization with a clock signal.

8. The semiconductor memory device of claim 7, wherein a time period between receipt of a memory command requesting performance of the memory operation and the generation of the test result data is longer than a clock cycle of the clock signal.

9. The semiconductor memory device of claim 1, wherein the memory operation is performed repeatedly.

10. The semiconductor memory device of claim 1, wherein the parallel bit test circuit includes a plurality of comparing units comparing the plurality of read data with the corresponding plurality of expected data, respectively, the plurality of comparing units generating comparison result data, and an operating unit performing a given logic operation on the comparison result data to generate the test result data.

11. The semiconductor memory device of claim 10, the comparison result data includes a plurality of comparison result data signals, and each of the plurality of comparing units outputs a given comparison result data signal at a first logic level if the compared read data and expected data are determined to be the same, and outputs the given comparison result data signal at a second logic level if the compared read data and expected data are determined not to be the same.

12. The semiconductor memory device of claim 11, wherein the operating unit outputs test result data at a first logic level if each of the plurality of comparison result data signals are set to the first logic level, and outputs test result data at a second logic level if at least one comparison result data signal is set to the second logic level.

13. The semiconductor memory device of claim 10, wherein each of the comparing units is an XOR gate and the operating unit is an OR gate.

14. A parallel bit test method testing a semiconductor memory device including a memory cell array having a plurality of memory cells, comprising:
   receiving a plurality of initial expected data through at least one address pad during a memory operation;
   generating a plurality of expected data based on the plurality of initial expected data, the at least one address pad being separate from a data input/output pad; and
   generating test result data based on a plurality of read data and the plurality of expected data.

15. The method of claim 14 wherein generating the test result data includes comparing the plurality of read data, which are read from the plurality of memory cells, respectively, with the plurality of expected data during the memory operation to generate the test result data.

16. The method of claim 14, wherein the memory operation is a read operation.

17. The method of claim 14, wherein the plurality of initial expected data correspond to the plurality of expected data, respectively.

18. The method of claim 17, wherein the plurality of initial expected data and the plurality of expected data have the same respective logic levels.

19. The method of claim 14, wherein the at least one address pad includes a plurality of address pads divided into a first address pad group and a second address pad group, and during the memory operation, a plurality of column addresses are supplied through the first address pad group, and the plurality of initial expected data are supplied through the second address group.

20. The method of claim 14, wherein the semiconductor memory device is a synchronous memory device that operates in synchronization with a clock signal.

21. The method of claim 20, wherein a time between receipt of a memory command requesting performance of the memory operation and the generation of the test result data is longer than a clock cycle of the clock signal.

* * * * *